(12) United States Patent
Brener et al.

(10) Patent No.: US 9,190,542 B1
(45) Date of Patent: Nov. 17, 2015

(54) PHOTOVOLTAIC CELL WITH LIGHT TRAPPING FOR ENHANCED EFFICIENCY

(71) Applicant: Sandia Corporation, Albuquerque, NM (US)

(72) Inventors: Igal Brener, Albuquerque, NM (US); Nche Tumasang Fofang, Albuquerque, NM (US); Ting S. Luk, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/555,438

(22) Filed: Nov. 26, 2014

Related U.S. Application Data

(60) Provisional application No. 61/909,422, filed on Nov. 27, 2013.

(51) Int. Cl.
*H01L 33/00* (2010.01)
*H01L 31/0216* (2014.01)
*H01L 31/056* (2014.01)

(52) U.S. Cl.
CPC ........ *H01L 31/02168* (2013.01); *H01L 31/056* (2014.12)

(58) Field of Classification Search
CPC ............... H01L 2924/12041; H01L 21/02532; H01L 31/022425; H01L 27/142
See application file for complete search history.

(56) References Cited

U.S. PATENT DOCUMENTS

2008/0169017 A1* 7/2008 Korevaar et al. ............. 136/249

OTHER PUBLICATIONS

Goetzberger, A. "Optical confinement in thin Si-solar cells by diffuse back reflectors," 15th Photovoltaic Specialists Conference, IEEE (1981) pp. 867-870.
Fofang, N.T. et al., "Substrate-modified scattering properties of silicon nanostructures for solar energy applications," Optics Express 21:4, (2013) pp. 4774-4781.
Spinelli, P. et al., "Broadband omnidirectional antireflection coating based on subwavelength surface Mie resonators," Nature Communications 3:692 (2012) pp.
Staude, I. et al., "Tailoring Directional Scattering through Magnetic and Electric Resonances in Subwavelength Silicon Nanodisks," ACS Nano 7 (9), (published online Aug. 16, 2013) pp. 7824-7832.
Wang, S. et al., "Large-Area Free-Standing Ultrathin Single-Crystal Silicon as Processable Materials," Nano Lett. 13 (2013) pp. 4393-4398.
Yablonovitch, E. "Statistical ray optics," J. Opt. Soc. Am. 72:7 (1982) pp. 899-907.
Yu, Z. et al., "Fundamental limit of nanophotonic light trapping in solar cells," PNAS 107:41, (published online before print on Sep. 27, 2010) pp. 17491-17496.

* cited by examiner

*Primary Examiner* — Seahvosh Nikmanesh
(74) *Attorney, Agent, or Firm* — Martin I. Finston

(57) ABSTRACT

The efficiency of a photovoltaic cell is enhanced by light trapping using Mie-scattering nanostructures. In one embodiment, an array of nanocylinders is formed on the front surface of a silicon film to enhance forward scattering into the film, and an array of nanocylinders is formed on the back surface to enhance backscattering so that more light is absorbed within the silicon film. In an alternate embodiment, a mirror layer is formed on the back surface of the silicon film to reflect light within the film back toward the front-surface nanocylinder array.

7 Claims, 5 Drawing Sheets

PHOTOVOLTAIC CELL WITH LIGHT TRAPPING FOR ENHANCED EFFICIENCY

CROSS-REFERENCE TO RELATED APPLICATION

This application claims priority to U.S. Provisional Patent Application No. 61/909,422, filed on Nov. 27, 2013 under the title, "ENHANCING EFFICIENCY IN THIN FILM SILICON SOLAR CELLS", the entirety of which is incorporated herein by reference.

STATEMENT OF GOVERNMENT RIGHTS

This invention was made with Government support under Contract No. DE-AC04-94AL85000 awarded by the U.S. Department of Energy. The Government has certain rights in the invention.

FIELD OF THE INVENTION

The invention relates to thin-film photovoltaic cells, and more particularly to the modification of the surfaces of thin-film photovoltaic cells to increase efficiency. Still more particularly, the invention relates to surface-modified thin-film silicon photovoltaic cells.

ART BACKGROUND

The relative inefficiency of photovoltaic cells has been one significant factor limiting the range of applications for which photovoltaic cells are a commercially viable source of alternative energy. One cause of inefficiency is reflection, across the pertinent part of the solar spectrum, from the front surface of the semiconductor film that contains the photovoltaic junction region. Monocrystalline silicon, for example, generally exhibits a reflectivity above 30% for quasi-normal incidence.

Several approaches have been tried for reducing the surface reflectivity of silicon films. One approach involves surface modification through reactive-ion etching, leading to a product referred as "black silicon", having a reflectivity that for quasi-normal incidence is reduced to values near 5%. Another approach is to overcoat the silicon surface with interference-type layers of dielectrics such as silicon nitride. The resulting antireflection coatings are effective for selected wavelengths.

Recently, P. Spinelli et al., "Broadband omnidirectional antireflection coating based on subwavelength surface Mie resonators," *Nature Communications* 3, Article No. 692 (Feb. 21, 2012), hereinafter "Spinelli et al.", reported a new type of antireflection coating using Mie resonators. A Mie resonance in the electromagnetic scattering cross section of a particle (Mie scattering theory is typically applied to spherical and cylindrical particles) is a value indicative of particularly strong or particularly weak scattering at a wavelength comparable to the geometrical size of the scattering particle.

Spinelli et al. found computationally and experimentally that a two-dimensional lattice of silicon nanocylinders of sub-wavelength dimensions fabricated on a silicon surface would exhibit Mie resonances strongly coupled to the underlying silicon substrate. Forward scattering from the nanocylinders, acting as Mie resonators, strongly suppressed reflection from the silicon surface. Pronounced line broadening was attributed to the electromagnetic coupling to the substrate, which provided a dissipative channel for radiation confined within the nanocylinders. Because of the line-broadening effect, the antireflective effect was observed to extend across a wide spectral range.

Another study of the electromagnetic scattering properties of silicon nanocylinders, useful in the present context, is reported in I. Staude et al., "Tailoring Directional Scattering through Magnetic and Electric Resonances in Subwavelength Silicon Nanodisks," *ACS Nano* 7 (9), (published online Aug. 16, 2013), 7824-7832 (hereinafter, "Staude et al.").

The entirety of Spinelli et al. and the entirety of Staude et al. are hereby incorporated herein by reference.

Although the anti-reflective approaches described above are useful for improving the efficiency of photovoltaic cells, there remains a need for new approaches that can drive up the efficiencies still further.

SUMMARY OF THE INVENTION

Another physical mechanism that is under study for enhancing photovoltaic conversion efficiency is the trapping of light within the photovoltaic semiconductor film. In contrast to approaches such as those described above which aim at increasing the penetration of incident light into the film, trapping-based approaches aim to increase the total path length traversed by incident photons while they remain within the film. Trapping is advantageous for several reasons: For a given film thickness, it increases the probability of bandgap absorption events, which can lead to higher photovoltaic conversion efficiency. It also permits the use of a film whose thickness is less than its intrinsic absorption length. This is advantageous because in at least some materials of practical interest, thinner films tend to be more efficient in the collection of photogenerated carriers.

We have found a new approach that enhances the trapping of light within the photovoltaic semiconductor film. Our approach is complementary to the approach of Spinelli et al. As explained above, Spinelli et al. added an array of Mie scatterers to the front surface of the film to produce forward scattering which reduces reflection. Conversely, we have found that an array of Mie scatterers added to the back surface of the film can produce backscattering that helps to contain light within the film. This enhances the trapping effect, which can in turn increase the photovoltaic conversion efficiency.

In implementations, arrays of Mie scatterers are included on both the front surface and the back surface of the photovoltaic film. This arrangement combines the respective benefits of antireflection and trapping, and it has the advantage that the trapping effect is enhanced by backscatter from both the front-surface array and the back-surface array.

Accordingly, an embodiment of the invention is a photovoltaic cell comprising a semiconductor film having a front and a back surface. Photovoltaic semiconductor junctions are defined within the semiconductor film. An antireflection array of nanostructures is formed on the front surface of the film and a trapping array of nanostructures is formed on the back surface.

In embodiments, the film and the nanostructures have the same intrinsic composition.

In embodiments, the film and the nanostructures are substantially composed of silicon.

In embodiments, the nanostructures are cylindrical pillars.

In embodiments, the nanostructures in each array are spaced far enough from each other to have no substantial electromagnetic interaction with each other.

In embodiments, the semiconductor film has a thickness of 1-10 µm.

In another embodiment, an array of nanostructures is formed on the front surface of the film, and a metallic mirror is formed on the back surface of the film. The nanostructure array behaves to externally incident light as the antireflection array, and to internally incident light, i.e. to light after reflection in the metallic mirror, it behaves as the trapping array.

BRIEF DESCRIPTION OF THE DRAWINGS

FIG. 2 represents the scattering spectrum as measured by an imputed power monitor oriented in a plane normal to the incident direction and positioned behind the body so as to intercept light forward scattered from the back surface. FIG. 3 is the spectrum as measured by an imputed power monitor oriented in a plane normal to the incident direction and positioned in front of the body so as to intercept light backscattered from the front surface.

DETAILED DESCRIPTION

The term "nanostructure" as used herein means a microfabricated body whose light-scattering behavior exhibits one or more Mie resonances. The discussion below is directed primarily to nanostructures that are fabricated in silicon on a silicon substrate. However, the choice of a silicon material system is merely illustrative and is not intended to be limiting as to the scope of the invention. Other examples of materials that may be suitable for similar purposes include germanium, various III-V semiconductors, and cadmium telluride and other II-VI semiconductors. These and others should be understood as falling within the scope and spirit of the invention.

Moreover, the nanostructures may be fabricated using a subtractive process, in which case they have the same intrinsic composition as the substrate, or they may be fabricated using an additive process. If an additive process is used, the nanostructures may be of a different composition from the underlying substrate. For example, the nanostructure may be composed of a dielectric material of a suitably high dielectric constant, whereas the substrate is a semiconductor.

Figure 1:
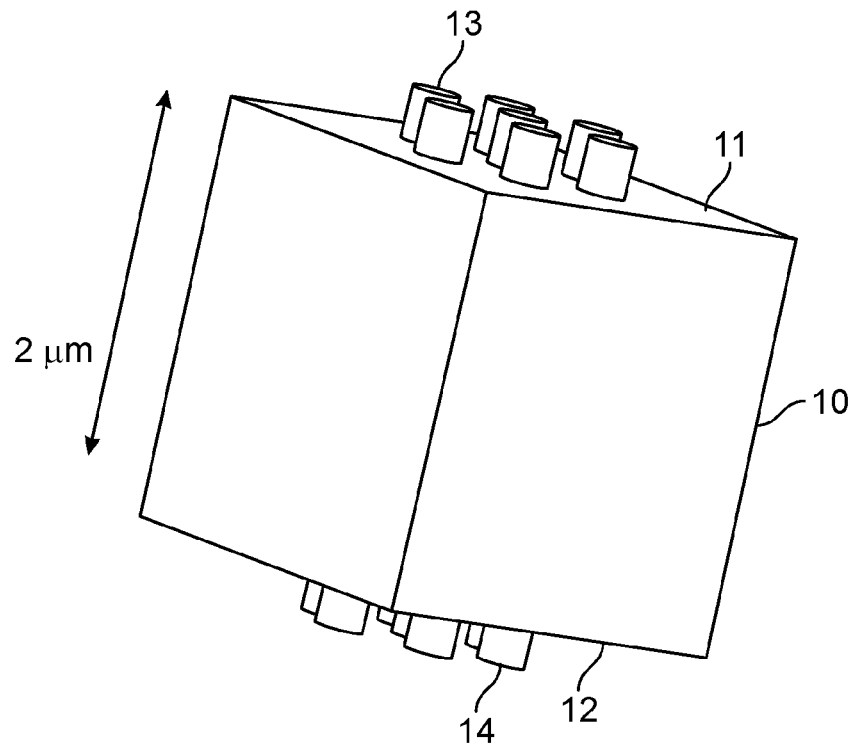
FIG. 1 is a perspective view of a portion of a semiconductor film including nanostructured arrays on its front and back surfaces according to an embodiment of the invention.

Turning now to FIG. 1, there is seen a semiconductor body 10 having a front surface 11 and back surface 12. Body 10 is symbolic of a semiconductor photovoltaic thin film that contains junction regions for the conversion of light to electricity. The front surface 11 is the surface that is impinged by electromagnetic radiation. An array of nanostructures 13 on the front surface is provided to suppress reflection of incident radiation from the front surface. An array of nanostructures 14 is provided on the back surface to enhance the trapping of electromagnetic radiation within body 10. Although only seven representative nanostructures 13, 14 are shown in the figure on the respective surfaces of body 10, it will be understood that in practice, the arrays will extend over a substantial portion of each surface, i.e. such portion as may be required to provide the desired reflective mitigation and trapping enhancement.

In an example as illustrated in FIG. 1, each nanostructure is a cylinder oriented with its cylinder axis normal to the surface of body 10. The exemplary cylinder has a diameter of 240 nm and a height of 240 nm. These dimensions were selected to produce an electric dipole resonance in an isolated silicon cylinder at an irradiative wavelength of 800 nm, and to produce a magnetic dipole resonance near 1000 nm. Without undue experimentation, one skilled in the art can find dimensions suitable for tuning the resonances to other wavelengths or for adapting the design to other materials through computational modeling using readily available simulation tools.

Within an array, the nanostructures can be arranged in any of various regular and irregular lattice patterns. One illustrative pattern is a hexagonal array in which each nanostructure (except those at the margins of the array) is placed at the center of a hexagon and surrounded by six further nanostructures placed equidistantly at the vertices of the hexagon. The arrangement of cylinders 13, 14 in FIG. 1 is exemplary of such an arrangement of seven nanostructures. As explained above, the arrangement is a small portion of a pattern that is repeated over a substantial portion of the film surface.

For at least some applications, it will be desirable to avoid electromagnetic coupling among the nanostructures because such coupling may modify the scattering properties. For example silicon nanostructures of the shape and dimensions described here, we believe that a center-to-center spacing of 480 nm will be sufficient to reduce inter-particle coupling to negligible levels.

For purposes of our numerical simulations which are described below, the semiconductor body was assumed to be a silicon film 2 μm in thickness. More generally, the film thickness should be at least the cylinder height in order to allow for the induction of an image electric dipole within the substrate at resonance. As will be seen below, this interfacial effect is important because it leads to a coupled magnetic dipole resonance at the same irradiative wavelength. The combined dipole effects cause highly directed scattering which can enhance the light-trapping effect.

There is no fundamental upper limit on the film thickness. Of course if the film thickness is greater than a few absorption lengths for the spectrum of interest, light trapping will not substantially improve the photovoltaic conversion efficiency. Thus in silicon, for example, it would not typically be advantageous to use a film substantially more than 50 μm in thickness.

Silicon has a critical angle of about 16°. Hence if the substrate is, e.g., 2 μm thick, scattered signals from a silicon nanoparticle on the front surface will escape from the back surface through an area with a diameter of about 1140 nm. This estimate provides rough guidance for assuring that the forward-scattered cone of light will impinge a back-side scatterer. As those skilled in the art will understand, this estimate is only valid for film thicknesses substantially greater than the wavelengths of interest.

We performed a series of numerical simulations using finite difference time domain (FDTD) modeling of an isolated nanostructure, of a silicon film without nanostructures, and of a silicon film with nanostructures on one or both major surfaces. The simulations were of the kind that uses a "total field scattered field" (TFSF) source, which is a plane-wave source designed for simulating nanoparticle scattering. The simulation space is divided into two regions: The internal region, referred to as the "total-field region," contains both the incident field (i.e., the source field) and the field due to scattering by the nanostructures. The external region, referred to as the "scattered-field region," contains only the scattered field.

Here we summarize some of our findings. Greater detail is provided in the Examples set out below. Briefly, we found that when an electric dipole is excited in a nanocylinder, an image dipole having the opposite polarity is induced in the substrate. The time-varying electric field between these two dipoles provides the displacement current that induces a magnetic dipole. In suitably chosen geometries, the induced magnetic dipole is resonant at the same frequency as the electric dipole. Geometries for which the electric and magnetic dipole resonances coincide are readily calculated for isolated nanoparticles. This can provide an initial starting point for a search algorithm to find suitable geometries when a substrate is added to the system.

We modeled an isolated silicon cylinder 240 nm in height and 240 nm in diameter, suspended in air and irradiated from air at normal incidence. In our simulations, the cylinder exhibited a Mie resonance near 800 nm that we attributed to electric dipole resonance and a Mie resonance near 1000 nm that we attributed to magnetic dipole resonance. When a 2 μm thick silicon substrate was added retaining the same irradiation geometry, the same resonances appeared but they were significantly broadened. We attribute the line-broadening to loss channels contributed by the substrate, which damp the resonances in the cylinder.

When the irradiation geometry was changed so that the cylinder was impinged at normal incidence from within the silicon substrate, a broad but strong resonance peak appeared near 900 nm and a weak shoulder appeared in the scattering spectrum near 1100 nm. The difference between this response and the response in the preceding scenario might relate to a difference in the electric fields that drive them.

More specifically, the dipole moment of the nanostructure varies in proportion to the field strength, and the nanostructure couples to its image within the substrate with a strength that depends on the dipole moment. That coupling strength, together with the respective dielectric constants of the nanostructure and the surrounding medium (here assumed to be air), determines the effective dielectric function of the nanostructure. The strength of the driving field is different, depending on whether the cylinder is impinged from air or from silicon. This might account for some of the difference between the two spectra.

In the scenarios (with substrate) that are described above, the resonances at 800 nm (incidence from air) and at 900 nm (incidence from silicon substrate) are not pure electric dipole modes, but instead are hybrids of electric and magnetic dipole modes. Our simulations showed that the substrate induces an antisymmetric electric dipole image which induces a magnetic dipole mode. Stated differently, the current of the image dipole is opposite to the original one, thus effectively emulating a circular current. This circular current is the source of a magnetic dipole.

Importantly, we observed a narrow angular distribution of scattered light that we attributed to constructive interference in the radiation field jointly scattered by the electric dipole resonance and by the magnetic dipole resonance that is induced at the same frequency, i.e. at the same optical wavelength.

Our modeling studies showed preferential scattering into the substrate at wavelengths of 800 nm and at 1050 nm for normal incidence from air and at a wavelength of 900 nm for normal incidence from within the substrate. This result confirmed the desirability of a photovoltaic cell design in which nanostructure arrays are included on both the front and the back surface of the photovoltaic semiconductor film. Our studies predicted that within a spectral range of practical interest, the use of such a structure on a 2 μm thick silicon film could reduce the scattered signal that escapes from the back surface by as much as about 80%.

More specifically, we modeled a 2 μm thick silicon substrate with a single cylindrical nanostructure on the front surface and a hexagonal arrangement of seven cylindrical nanostructures on the back surface. Dimensions and spacing of the nanostructures were as described above. The seven nanostructures were thus spread over an area having a diameter of 1200 nm. Irradiation was normally incident on the front surface.

Figure 2:
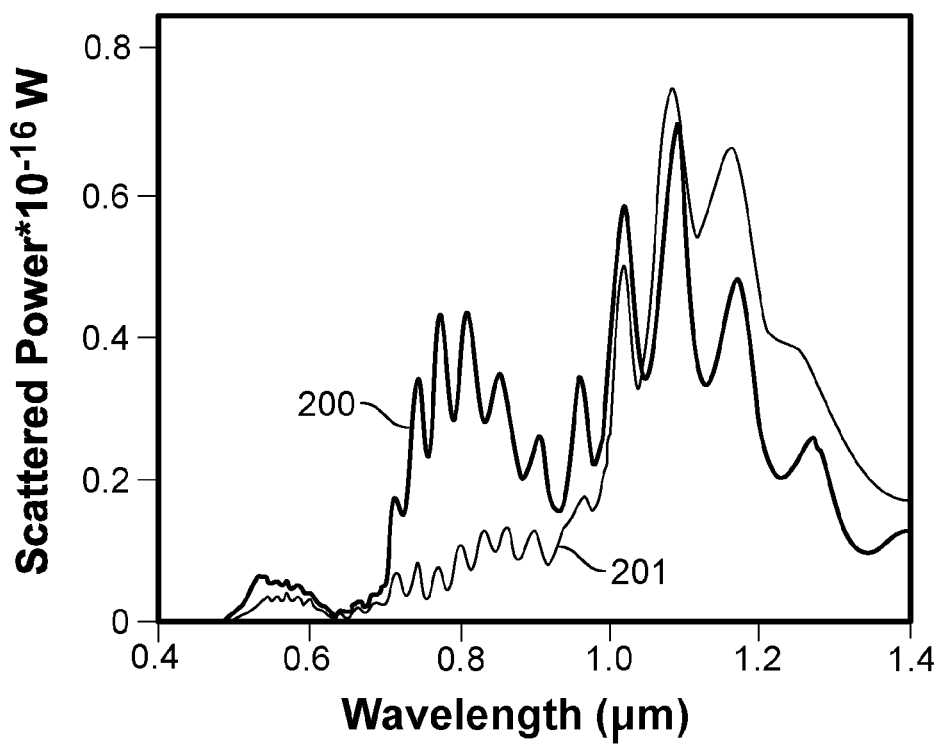
FIGS. 2 and 3 are spectra of the optical power scattered from a structure similar to the structure of FIG. 1 as computed by numerical modeling.
Figure 3:
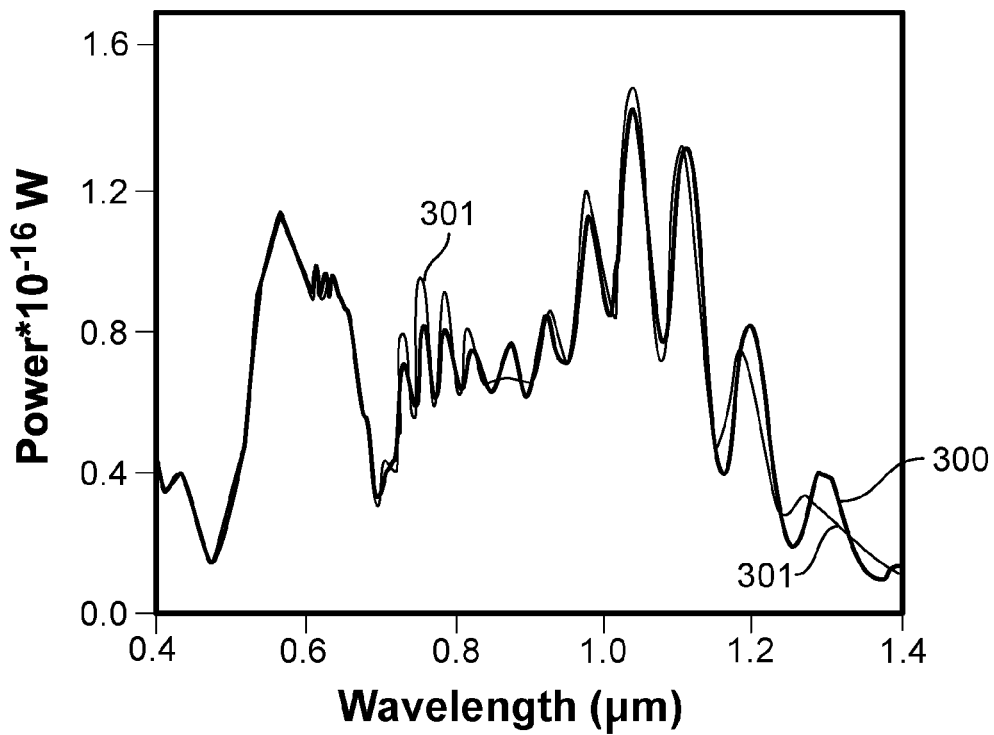

FIG. 2 is the spectrum of scattered power as measured by an imputed power monitor oriented in a plane normal to the incident direction and positioned behind the body so as to intercept light forward scattered from the back surface. FIG. 3 is the spectrum of scattered power as measured by an imputed power monitor oriented in a plane normal to the incident direction and positioned in front of the body so as to intercept light backscattered from the front surface.

In FIG. 2, curve 200 is the spectrum obtained when there are no nanostructures on the back side of the film. Curve 300 of FIG. 3 is likewise the spectrum obtained when there are no nanostructures on the back side of the film. In FIG. 2, curve 201 is the spectrum obtained when nanostructures are included on the back side of the film. Curve 301 of FIG. 3 is likewise the spectrum obtained when there nanostructures are included on the back side of the film.

It will be seen upon inspection of FIGS. 2 and 3 that when the back surface is patterned with silicon nanostructures, significantly less scattered power escapes from the back side of the cell for wavelengths from 700 nm to 1050 nm, whereas more scattered power escapes at wavelengths greater than 1050 nm. This is consistent with the results of our modeling of the angular dependence of the scattering, which indicated that at a wavelength of 1100 nm a structure with back-surface nanostructures scatters preferentially in the forward direction (i.e. the direction of transmission through the cell) whereas at 900 nm it scatters preferentially in the backward direction.

The paper by A. Goetzberger, "Optical confinement in thin Si-solar cells by diffuse back reflectors," 15*th Photovoltaic Specialists Conference*, IEEE (1981) 867-870 provides a method to calculate the total absorption efficiency of a thin silicon solar cell having a diffuse back reflector. We combined this technique with our own calculations of the angular scattering distribution for silicon nanoparticles on a silicon substrate for all wavelengths of interest. In this manner, we were able to calculate the fraction of total scattered power from a front-side silicon nanoparticle that is trapped within the 2 μm thick silicon photovoltaic film having a back-side array of nanoparticles as described above.

Figure 4:
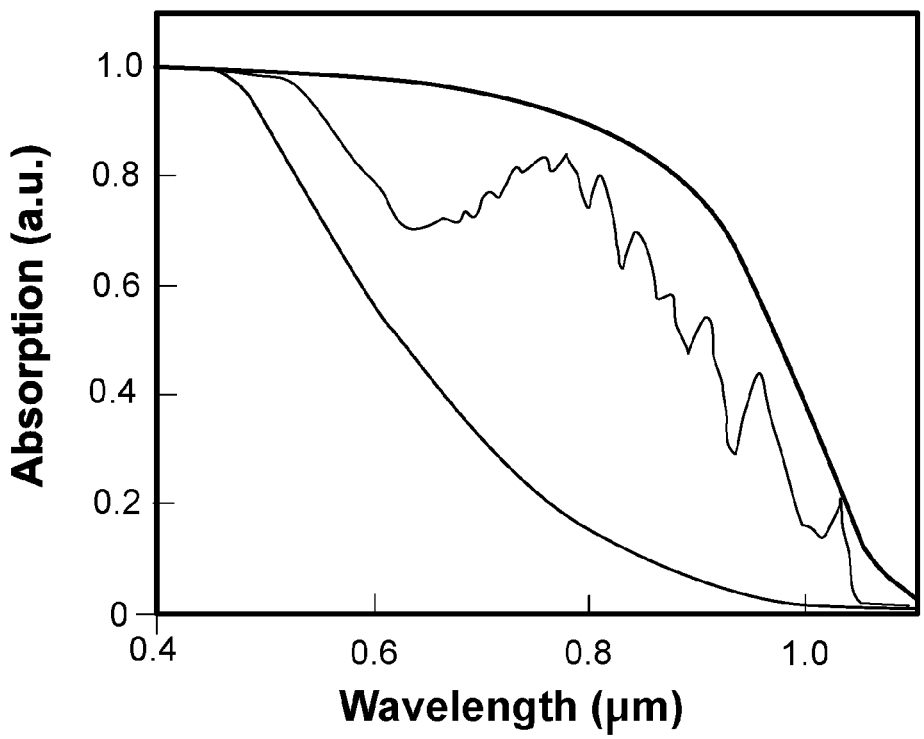
FIG. 4 is a set of three spectral curves in which the fraction of light trapped within a respective semiconductor structure is plotted as a function of wavelength. The middle curve represents the absorption of light within the structure of FIG. 1, i.e., an example film having nanocylinder arrays on both its front and back surfaces. The bottom curve illustrates for comparison the absorption of light within a silicon film of 2 µm thickness having featureless front and back surfaces. The top curve represents absorption at the Yablonovitch theoretical limit for silicon photovoltaic cells. The Yablonovitch limit, which in a strict sense applies only to thick cells, is a theoretical upper bound on absorption enhancement in a medium due to light trapping. According to the Yablonovitch limit, the enhancement cannot exceed a factor of $4n^2/\sin 2\theta$, where n is the refractive index of the active layer of the cell and $\theta$ is the angle of the emission cone in the medium surrounding the cell.

The result is shown as the middle curve in FIG. 4, which plots the optical absorption of the film as a function of wavelength. For comparison, the bottom curve in the figure plots the absorption by a 2 μm thick silicon film without nanostructures, and the top curve plots the theoretical absorption of the same film in the Yablonovitch limit. A discussion of the Yablonovitch limit may be found in E. Yablonovitch, "Statistical ray optics," *J. Opt. Soc. Am.* 72 vol. 7 (1982) 899-907.

We calculated short-circuit currents for the three cases illustrated in FIG. 4, assuming 100% internal quantum efficiency and using the standard AM1.5 model solar spectrum. The results were 34.5 mA/cm$^2$ in the Yablonovitch limit, 26.7 mA/cm$^2$ for the double-sided cell, and 14.1 mA/cm$^2$ for a 2 μm thick silicon film without nanostructures.

Example I

Figure 5:
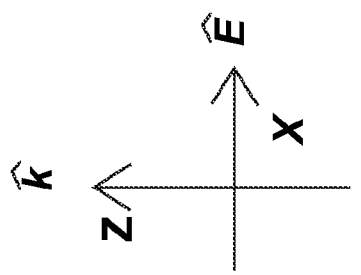
FIG. 5 schematically illustrates three different scenarios that were modeled using finite difference time domain (FDTD) simulation with a total field scattered field (TFSF) source as indicated in the figure as a three-dimensional box, one side of which is used as the injection plane. Scenario A is an isolated nanocylinder, Scenario B is a silicon film with a front-surface nanocylinder impinged from air, and Scenario C is the silicon film with a back-surface cylinder impinged from within the silicon film. Coordinate directions are also indicated in the figure, with incidence along the z-axis (in the negative z-direction for scenario C). Polarization is along the x-axis, which lies in the plane of the figure.
Figure 5:
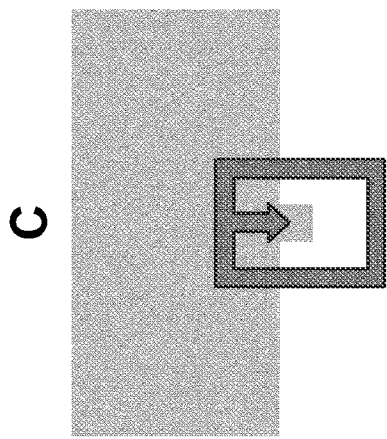
Figure 5:
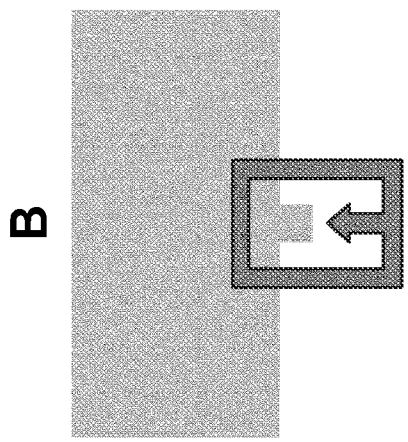
Figure 5:
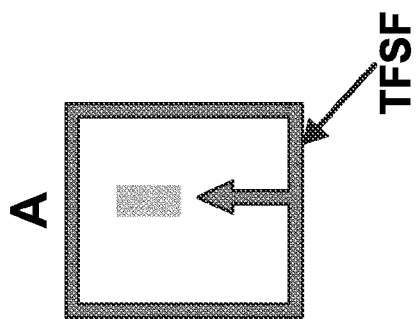

We performed FDTD modeling as described above. Three scenarios were modeled as shown in FIG. 5: Scenario A was the isolated nanocylinder, Scenario B was the silicon film with front-surface nanocylinder impinged from air, and Scenario C was the silicon film with back-surface cylinder impinged from within the silicon film.

Figure 6:
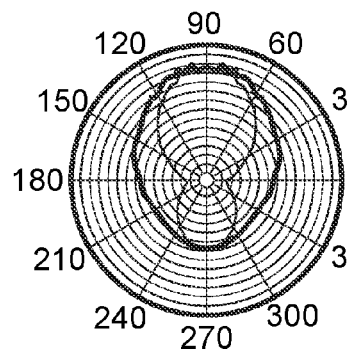
FIG. 6 provides a polar plot illustrating the angular scattering pattern calculated for Scenario A, i.e. for an isolated silicon nanocylinder suspended in air, when irradiated at a resonant wavelength of 800 nm. The field quantity that is plotted is the electric field intensity $|E|^2$. The 90° angular coordinate signifies the forward scattering direction. Two superimposed curves are provided in this and subsequent figures, one curve representing the scattering pattern in the zx-plane and the other curve representing the scattering pattern in the zy-plane.
Figure 7:
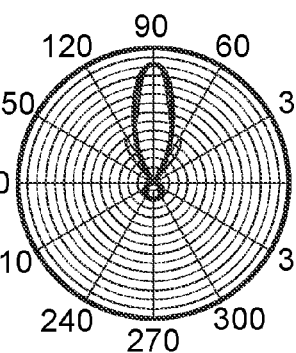
FIG. 7 provides a polar plot illustrating the calculated angular scattering pattern for Scenario B at a resonant wavelength of 800 nm. In the figure view, scattering into the angular range 0° to 180° signifies scattering into the substrate. The 90° angular coordinate signifies normal penetration into the substrate.
Figure 8:
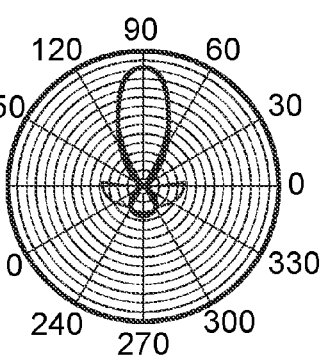
FIG. 8 provides a polar plot illustrating the calculated angular scattering pattern for Scenario C at a resonant wavelength of 900 nm. In the figure view, scattering into the angular range 0° to 180° signifies backscattering into the substrate. Thus the 90° angular coordinate signifies exact reversal of the incident direction. It should accordingly be understood that in the respective figure views, the 90° direction in FIG. 8 is reversed from the 90° direction in the preceding figure.

FIGS. 6-8 provide polar plots of the angular distribution of the scattered power at a resonance wavelength of 800 nm for scenarios A and B (FIGS. 6 and 7 respectively) and at a resonance wavelength of 900 nm for scenario C (FIG. 8). The source is polarized in one of the two principal directions.

The polar plot of the scattered power for scenario A at a wavelength of 800 nm clearly indicates electric dipole scattering characteristics.

It is important to note that for Scenarios B (wavelength at 800 nm) and C (wavelength at 900 nm), the resonances are hybrids of electric and magnetic dipole modes. They are not pure electric dipole modes as in Scenario A. The presence of the silicon substrate induces an anti-symmetric electric dipole image which results in an induced magnetic dipole mode.

The angular distribution plots show another distinction between scattering for a silicon nanostructure in air (Scenario A) and a silicon nanostructure on a silicon substrate (scenarios B and C). That is, the polar plots for scenarios B and C show a very narrow angular distribution of scattered power relative to Scenario A, and they also show preferential scattering into the silicon substrate. Also evident is a drastic narrowing of the angular distribution of scattered power. We attribute this narrow scattering distribution to the coincidence of the electric and the induced magnetic dipole resonances at the same wavelength and to constructive interference of the scattered light from the induced magnetic and electric dipoles.

Figure 9:
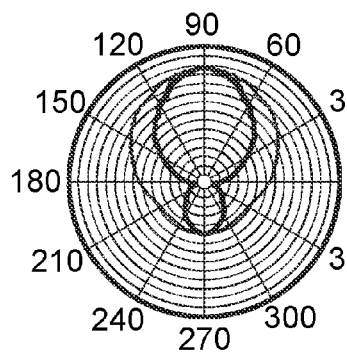
FIG. 9 provides a polar plot similar to the plot of FIG. 6, but at a magnetic dipole resonant wavelength of 1000 nm.
Figure 10:
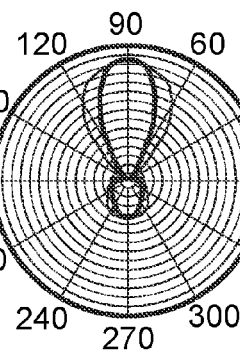
FIG. 10 provides a polar plot similar to the plot of FIG. 7, but at a magnetic dipole resonant wavelength of 1050 nm.
Figure 11:
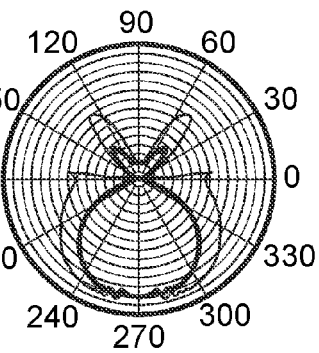
FIG. 11 provides a polar plot similar to the plot of FIG. 8, but at a magnetic dipole resonant wavelength of 1100 nm.

FIGS. 9-11 provide polar plots of scattered power at magnetic dipole resonant wavelengths of 1000 nm for scenario A (FIG. 9), 1050 nm for scenario B (FIG. 10), and 1100 nm for scenario C (FIG. 11). It is evident from a comparison between FIG. 8 and FIG. 11 that at a wavelength of 1100 nm scenario C scatters preferentially in the forward direction whereas at 900 nm, it scatters preferentially in the backward direction.

Example II

In an alternate embodiment, an array of nanocylinders is created on the front surface of the silicon layer. Instead of a back-surface nanocylinder array, a metallic mirror is created on the back surface of the silicon layer. In essence, the reflective image of the front-side antireflection array serves as the back-side trapping array.

This simplifies the fabrication process, since only one side of the photovoltaic cell needs to be patterned with nanostructures. Moreover, the metallic array, which may be made, e.g., from deposited silver or aluminum, can also be used for the back-side electrode.

Figure 12:
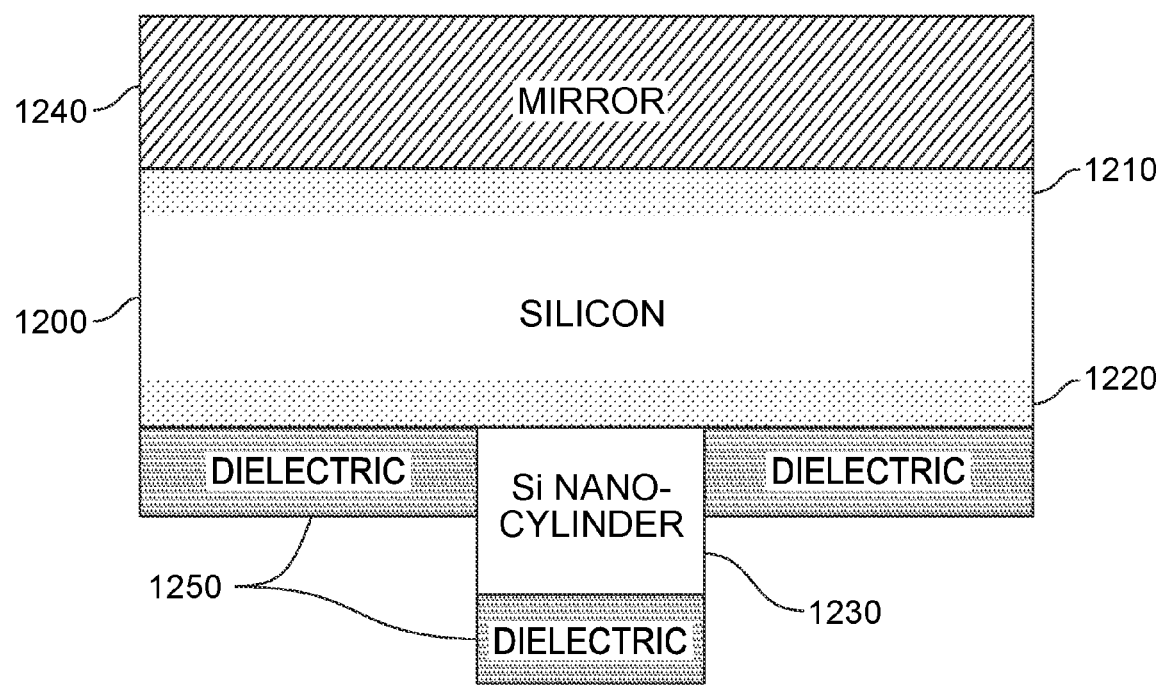
FIG. 12 provides a schematic, cross-sectional view of a portion of a photovoltaic cell according to an alternate embodiment of the invention in which there is a front-surface nanostructure array and a back-surface metallic mirror.

We performed numerical simulations to predict the performance of such an arrangement. The simulated structure is illustrated in FIG. 12. As seen, the structure includes silicon layer 1200, which has a doped region 1210 near the back surface and an oppositely doped region 1220 near the front surface. One silicon nanocylinder 1230 is shown formed on the front surface of the silicon layer. The structure further includes back-surface mirror layer 1240 which for purposes of the simulation is silver, but which could alternatively be of other metallic materials such as aluminum. A conventional antireflection coating layer 1250 is shown covering the front surface of the silicon layer and the front surface of the nanocylinder. For purposes of the simulation, layer 1250 is modeled as a dielectric having a dielectric constant of 1.7.

The preferred conductivity types for doped regions 1210 and 1220 may be dependent on the specific composition of the mirror layer and will be evident to those skilled in the art.

Mirror layer 1240 serves as the backside electrode for the device. In practical implementations, layer 1250, or portions thereof, can serve as the front-side electrode. For such purpose, it is advantageous to form layer 1250 from a transparent conductive material such as indium tin oxide (ITO).

We computed the short-circuit current $J_{sc}$ of the device for various geometries. The geometrical parameters were thickness $t_{Si}$ of the silicon layer, thickness $t_{ar}$ of the dielectric layer, and diameter D and height H of the nanocylinder. An example range for the thickness of the silicon film is 200-1000 nm. An example range for the nanocylinder diameters and heights is 200-280 nm.

Our specific designs and the results they provided are shown in Table 1.

TABLE 1

| $t_{Si}$ (nm) | $t_{ar}$ (nm) | D (nm) | H (nm) | $J_{sc}$ (mA/cm$^2$) |
|---|---|---|---|---|
| 300 | 60 | 260 | 200 | 21.9 |
| 350 | 60 | 260 | 200 | 22.7 |
| 400 | 60 | 260 | 200 | 23.5 |
| 450 | 60 | 260 | 200 | 23.6 |

We attribute the predicted performance of the modeled structure to a combination of the antireflection coating, non-resonant scattering, grating diffraction, and the matching of electric and magnetic dipole resonances. In this particular structure, however, although the matching of the electric and magnetic dipoles may be a factor, we have not confirmed whether it is a dominant factor.

A structure of the kind illustrated in FIG. 12 can be made according to the following procedure, beginning with a free-standing silicon film several micrometers thick. Suitable methods for producing a silicon film are known. One such method is described in S. Wang et al., "Large-Area Free-Standing Ultrathin Single-Crystal Silicon as Processable Materials," *Nano Lett.* 2013 (13) 4393-4398, the entirety of which is hereby incorporated herein by reference.

1. Deposit the silver (or other metal) layer on the top side of the thin silicon film.
2. Coat negative photoresist on the bottom side of the silicon film.
3. Using interferometric lithography, pattern the negative photoresist with the desired diameters and pitch sizes for the nanostructures.
4. Develop the negative photoresist.
5. Using the negative photoresist as an etch mask, perform a fluorine-based dry etch to create silicon posts with the desired height.
6. Deposit ITO to form a contact layer on the bottom side of the silicon film.

We claim:

1. A photovoltaic cell, comprising:
    a semiconductor film having front and back surfaces;
    a photodiode structure defined within the semiconductor film;
    a front array of Mie scatterers disposed in a layer proximal the front surface of the semiconductor film, wherein the Mie scatterers are nanocylinders dimensioned to provide enhanced forward scattering of externally incident light in a range of wavelengths effective for photovoltaically stimulating the photodiode structure; and
    a rear confinement layer proximal the back surface of the semiconductor film, wherein the rear confinement layer defines a real or effective back array of Mie scatterers.

2. The photovoltaic cell of claim 1, wherein the rear confinement layer is a mirror layer of metallic material that defines an effective back array of Mie scatterers as a reflective image of the front array of Mie scatterers.

3. The photovoltaic cell of claim 1, wherein the rear confinement layer comprises a rear array of Mie scatterers, and the Mie scatterers in said rear array are nanocylinders.

4. The photovoltaic cell of claim 3, wherein the nanocylinders of the front and rear arrays of Mie scatterers have the same dimensions.

5. The photovoltaic cell of claim 1, wherein the nanocylinders are composed of silicon, germanium, a III-V semiconductor, or a II-VI semiconductor.

6. The photovoltaic cell of claim 1, wherein the semiconductor film and the nanocylinders are composed of silicon, and the nanocylinders have diameters and heights that are both in the range 200-280 nm.

7. The photovoltaic cell of claim 6, wherein the silicon semiconductor film is at least 200 nm but not more than 1 μm thick.

* * * * *